United States Patent [19]

Wright

[11] Patent Number: 4,894,016

[45] Date of Patent: Jan. 16, 1990

[54] ELECTRICAL CONNECTOR

[75] Inventor: John O. Wright, Warren, Pa.

[73] Assignee: GTE Products Corporation, Stamford, Conn.

[21] Appl. No.: 211,945

[22] Filed: Jun. 27, 1988

[51] Int. Cl.[4] .............................................. H01R 9/09
[52] U.S. Cl. ......................................... 439/76; 439/85; 439/736
[58] Field of Search .............................. 439/76, 80–82, 439/78, 733, 736, 85

[56] References Cited

U.S. PATENT DOCUMENTS

| | | | |
|---|---|---|---|
| 2,958,064 | 10/1960 | Swengel | 439/85 |
| 3,270,251 | 8/1966 | Evans | 439/80 |
| 3,413,594 | 11/1968 | Fernald et al. | 439/736 |
| 4,030,799 | 6/1977 | Venaleck | 439/736 |
| 4,591,220 | 5/1986 | Impey | 439/85 |
| 4,609,241 | 9/1986 | Peterson | 439/85 |
| 4,689,103 | 8/1987 | Elarde | 439/85 |

Primary Examiner—P. Austin Bradley
Attorney, Agent, or Firm—William H. McNeill

[57] ABSTRACT

A stepped electrical connector having a printed circuit board mounted in an electrically insulating housing. The board has a first collection of electrical contacts extending in a given direction and a second collection of contacts extending in the opposite direction. The number of contacts in the second collection is less than the first collection and the circuitry on the board accommodates the difference.

2 Claims, 1 Drawing Sheet

ELECTRICAL CONNECTOR

TECHNICAL FIELD

This invention relates to electrical connectors and more particularly to such connectors for use when the connector is required to have a difference in contact count between the input side and the output side.

BACKGROUND ART

Connectors for the above-recited purpose frequently employed hard wiring; complex metal forms; wire forms, etc. These constructions were expensive to manufacture.

SUMMARY OF THE INVENTION

It is an object of the invention to obviate the disadvantages of the prior art.

It is another object to enhance electrical connectors. These objects are accomplished, in one aspect of the invention, by the provision of a connector having an insulating housing with a printed circuit board mounted therein. The board has first and second sets of apertures therein interconnected in a desired pattern. A first collection of contacts is fixed in the first set of apertures and a second collection of contacts is fixed in the second set of apertures. The first and second collections of contacts extend in opposite directions from one another and the number of contacts in the second collection is less than the number in the first collection.

In a preferred embodiment, both the first and second collections are male contacts.

This novel connector is easy and inexpensive to manufacture and is very rugged.

BEST MODE FOR CARRYING OUT THE INVENTION

Figure 1:
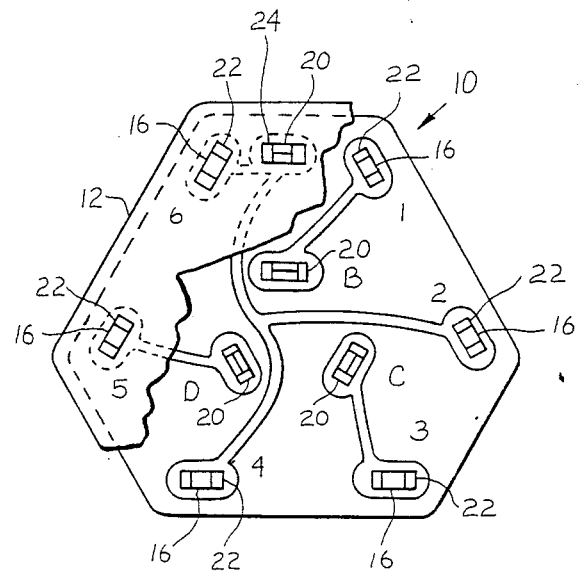
FIG. 1 is a Plan view of the invention with some parts omitted and some parts broken away for clarity.
Figure 2:
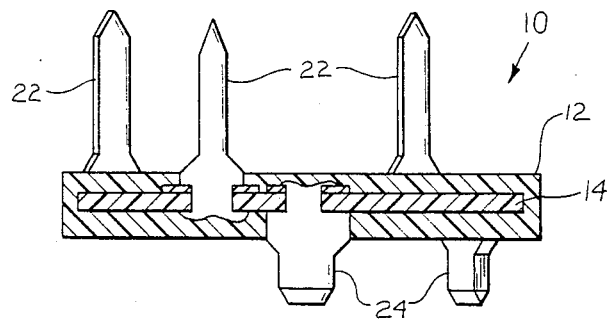
FIG. 2 is a diagrammatic, elevational sectional view thereof.

Referring to now to the drawings, there is shown in FIG. 1 an electrical connector 10 having an electrically insulating housing 12 with a printed circuit board 14 therein. The board 14 has a first set of apertures 16, numbered 1 thru 6; and a second set of apertures 20, labeled A thru D. The first and second sets are electrically interconnected in a desired Pattern. In the embodiment shown, aperture 1 is connected to aperture B; aperture 3 is connected to aperture C; aperture 5 is connected to aperture A; and apertures 2, 4, and 6 are all interconnected to aperture D. Each of the first set of apertures 16 has an electrical contact 22 therein, extending in a given direction, thus forming a first collection of contacts.

Each of the second set of apertures 20 has an electrical contact 24 therein, extending in a direction opposite to the given direction.

As can be seen from FIG. 1, the number of contacts 22 and the number of contacts 24 is not equal; thus, there is provided a novel and simple electrical connector for use where a difference in contact count between input and output is needed. Of course, the illustration of six contacts in the first collection and four contacts in the second collection is exemplary only.

Also, the contacts 22 and 24 are shown as being male contacts and being swaged into the printed circuit board 14, and may additionally be soldered therein. Other techniques can be employed for mounting the contacts; e.g., the apertures 1 thru 6 and A thru D can comprise plated-thru-holes and the contacts can be friction fitted therein by means of a compliant portion.

Likewise, the housing 12, of a suitable material such as plastic, can be molded about the printed circuit board after the contacts have been positioned therein; or the housing can be manufactured as a two part hollow structure with appropriate provision for the mounting the board and receiving the contacts.

While there have been shown and described what are at present considered to be the preferred embodiments of the invention, it will be apparent to those skilled in art that various changes and modifications can be made herein without departing from the scope of the invention as defined by the appended claims.

I claim:

1. An electrical connector comprising: an electrically insulating housing; a printed-circuit board within said housing, said printed circuit board having first and second sets of aperatures therein interconnected in a desired pattern; a first collection of electrical contacts fixed in said first set of apertures and extending outwardly therefrom, through said housing in a given direction; a second collection of electrical contacts fixed in said second set of apertures and extending outwardly therefrom, through said housing and in a direction opposite to said given direction; the number of contacts in said second collection being less than the number of contacts in said first collection.

2. The electrical connector of claim 1 wherein the contacts of said first and second collections are male contacts.

* * * * *